(12) United States Patent
Ivers et al.

(10) Patent No.: US 7,139,426 B2
(45) Date of Patent: Nov. 21, 2006

(54) HISTOGRAM DATA COLLECTOR FOR APPLYING PROGRESSIVELY ADJUSTED HISTOGRAM EQUALIZATION TO AN OSCILLOSCOPE IMAGE

(75) Inventors: Kevin T. Ivers, Woodland, WA (US); Paul M. Gerlach, Beaverton, OR (US); Daniel E. Taylor, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 761 days.

(21) Appl. No.: 10/338,206

(22) Filed: Jan. 7, 2003

(65) Prior Publication Data

US 2003/0152266 A1    Aug. 14, 2003

Related U.S. Application Data

(60) Provisional application No. 60/356,883, filed on Feb. 12, 2002.

(51) Int. Cl.
*G06K 9/00* (2006.01)
(52) U.S. Cl. .................................................. 382/169
(58) Field of Classification Search ............... 382/168, 382/169; 345/440.1; 702/66, 67
See application file for complete search history.

(56) References Cited

U.S. PATENT DOCUMENTS 5,909,244 A    6/1999  Waxman
5,986,637 A   11/1999  Etheridge
5,995,656 A   11/1999  Kim
6,545,681 B1 * 4/2003  Passi et al. ................. 345/440

FOREIGN PATENT DOCUMENTS

| EP | 0822416 A | 2/1998 |
| EP | 0947840 A | 10/1999 |
| EP | 1022679 A | 7/2000 |
| WO | WO0146907 A | 6/2001 |

* cited by examiner

*Primary Examiner*—Phuoc Tran
(74) *Attorney, Agent, or Firm*—David N. Caracappa; Thomas F. Lenihan

(57) ABSTRACT

A system is disclosed for equalizing the distribution of pixel intensities in an image displayed by an oscilloscope. In a primarily software implementation, the maximum pixel intensity (I) present in the rasterized input image, the maximum available display intensity (P) and the desired image resolution (R) are the input variables which permit the calculation of thresholds or bins to which each pixel is assigned. By iteratively performing the analysis of existing pixel intensities and bin thresholds, the number of pixels in each bin may be optimized to form an equalized histogram. Another implementation of the histogram equalization system utilizes software to optimize a hardware-based histogram collector.

20 Claims, 14 Drawing Sheets

HISTOGRAM DATA COLLECTOR FOR APPLYING PROGRESSIVELY ADJUSTED HISTOGRAM EQUALIZATION TO AN OSCILLOSCOPE IMAGE

CLAIM OF PRIORITY

This application is based on and claims priority from U.S. Provisional Application Ser. No. 60/356,883, filed on Feb. 12, 2002.

FIELD OF THE INVENTION

The subject invention relates generally to the field of oscilloscope display systems, and more particularly to an oscilloscope employing and displaying histograms.

BACKGROUND OF THE INVENTION

Current oscilloscopes can display images of waveforms derived from an internal image which may possess a large dynamic range of pixel intensities. Although the variation in pixel intensity of the internal image may be large, the actual display of this image limits the intensity range and therefore does not fully reflect all of the information contained in the internal image. An example of an oscilloscope which illustrates this problem is disclosed in U.S. Pat. No. 5,986,637 entitled DIGITAL OSCILLOSCOPE ARCHITECTURE FOR SIGNAL MONITORING WITH ENHANCED DUTY CYCLE, issued to Etheridge et al. The Etheridge et al. device increases the percentage of time that an input signal is actively monitored in an attempt to detect and ultimately display rare, anomalous and nonrepetitive events.

Etheridge et al. illustrates the fact that as acquisition technology improves, greater dynamic range of the internal image intensity is created from the increased number of signal acquisitions incorporated into a single waveform image. However, due to limitations in existing display technology it is not possible to display this enhanced dynamic range. Current oscilloscopes typically deliver only sixteen levels of dynamic range in brightness to the user. Future oscilloscopes will probably present a brightness range of 64 or more (i.e., 256) levels.

Since the displayable dynamic range is limited, the desired goal is to extract the maximum intensity variation and hence the maximum signal information from the internal waveform image. Ideally, a method to automatically and fully utilize the available, limited dynamic range of the display, and a machine to implement that method, is needed. Histogram equalization is a known image processing method for increasing contrast and utilizing dynamic range in an image. An example of such image processing is disclosed in U.S. Pat. No. 5,995,656 entitled IMAGE ENHANCING METHOD USING LOWPASS FILTERING AND HISTOGRAM EQUALIZATION AND A DEVICE THEREFORE, issued to Kim. By adjusting the intensities of an image such that the histogram of image intensities is flat, the best representation of the full dynamic range of intensities present in the image is realized.

Intensity adjustment allows many pixels of similar intensities, which were previously displayed in a similar manner, to appear with differing intensities, allowing the user to discern additional signal detail from the intensity variations. A histogram is a representation of the relative distribution of the intensities appearing in an image. FIG. 1, for example, is a typical input histogram 35 that results from a television sweep signal. The histogram 35 creates a series of compartments or columns, such as regions 17, 18, 19 and 20, each of which represents a subset or range of potential pixel intensities present in the image. The intensity of each pixel is examined and is assigned to the appropriate histogram column or "bin" which matches the detected intensity. If there is an even distribution of intensities in an image, the histogram is therefore "level" or "equalized" because bin counts are the same. As seen in FIG. 1, the histogram 35 is typically uneven, with most of the measured pixel intensities being grouped near bins 17, 18 and 19 with virtually no picture elements residing in region 20 or beyond.

Referring also to FIG. 2, a transfer function 242 is depicted which may be applied to the raw input image histogram of FIG. 1. The transfer function 242 includes numerous discrete break points or transitions 21, 22, 23, 24, 25, 26, 27, 28, 30 and 31 which define, in this case, a series of linear transfer functions of varying slopes. By applying an input image to the transfer function 242, the output histogram 33 depicted in FIG. 3 is produced. While the distribution of intensities has been improved, there are still regions such as 4, 5, 14 and 15 which include relatively large amounts of data while regions 6, 11, 12 and 16 contain relatively little image data. Thus a substantially flat output histogram has not been obtained, which is typical when using a discrete histogram equalization system. Referring also to FIG. 11, a representative image 240 produced by a typical prior art oscilloscope is shown. The regions 233, for example are primarily blue in color while regions 234 are primarily green, with very few other colors present. The viewer of such an image is left to wonder if the image 240 represents the actual waveform being measured or is primarily an artifact of the oscilloscope signal processing circuitry.

Programmable mapping machines exist that can be used to transfer an image having a large dynamic range to a display having a small dynamic range, such as is disclosed in U.S. Pat. No. 5,909,244, entitled REAL TIME ADAPTIVE DIGITAL IMAGE PROCESSING FOR DYNAMIC RANGE REMAPPING OF IMAGERY INCLUDING LOW LIGHT VISIBLE IMAGERY, issued to Waxman et al. This device can implement linear mapping or a gamma corrective mapping.

SUMMARY OF THE INVENTION

The present invention addresses the problem of applying histogram equalization to an oscilloscope waveform display. The dynamic range of display intensities is more fully utilized. This allows the user to more easily discern the difference in intensities between pixels, the pixels indicating the frequency or magnitude of rasterized image data.

The present invention typically enables the user to view all of the steady state waveforms present on the display screen that may otherwise have been obscured using a more typical linear display function. The histogram equalization algorithm is applied during mapping from a rasterized image with a large dynamic range to the much smaller dynamic range of the display device.

The mapper hardware which reduces the dynamic range is also used to compute a histogram of the displayed output image based on the input image and the existing mapping function. The histogram generated has only as many regions or bins as the output image has levels of intensity. This technique limits the information content of the histogram, but allows much faster computation than taking a histogram of the input image. This is a significant feature of the present invention insofar as the histogram equalization is accomplished by examining the existing histogram and computing a new mapping function to be applied to the original image. The original mapping function may be programmed as a linear mapping of the input image based on the maximum input image pixel value. Since a histogram of the output image cannot fully represent all the information of a histogram of the input image, any mapping function generated from the output image may not precisely equalize the histogram. For this reason a histogram equalization function adjustment algorithm has been developed that can be run in multiple passes, once each time the function generates a new output image histogram. The adjustment algorithm attempts to adjust the original mapping function to further equalize the histogram.

Mapping of the input image to a smaller dynamic range can occur simultaneously with the collection of histogram data, or mapping can occur without writing to memory, or only collection of the histogram information can occur. The histogram equalization function adjustment algorithm is applied to an oscilloscope image to improve the equalization properties of the mapping function. The new mapping function is then applied to the next image to be mapped. The assumption is made that the next image will be similar to the previous image or at least possess the same input histogram properties. This assumption and the prediction of the histogram properties of subsequent images saves processing time as a separate histogram collection function does not need to be executed. Typically the histogram collection of the current image is done while mapping the current image for display.

When the series of images for display does have changing histogram properties, the changes will typically be fairly minor from image to image. The histogram equalization function adjustment algorithm follows those changes and thereby maintains an appropriate histogram equalization function for most of the output images to be displayed. Whenever the image has a large change from image to image (e.g. adding or removing a signal) the algorithm may require several successive images in order to fully adjust.

The present invention may be used successfully with many other common image processing algorithms utilized for oscilloscope images. Examples of such algorithms include histogram specification, local histogram enhancement, image subtraction, high-boost filtering and median filtering.

DETAILED DESCRIPTION OF THE EMBODIMENTS

Figure 5:
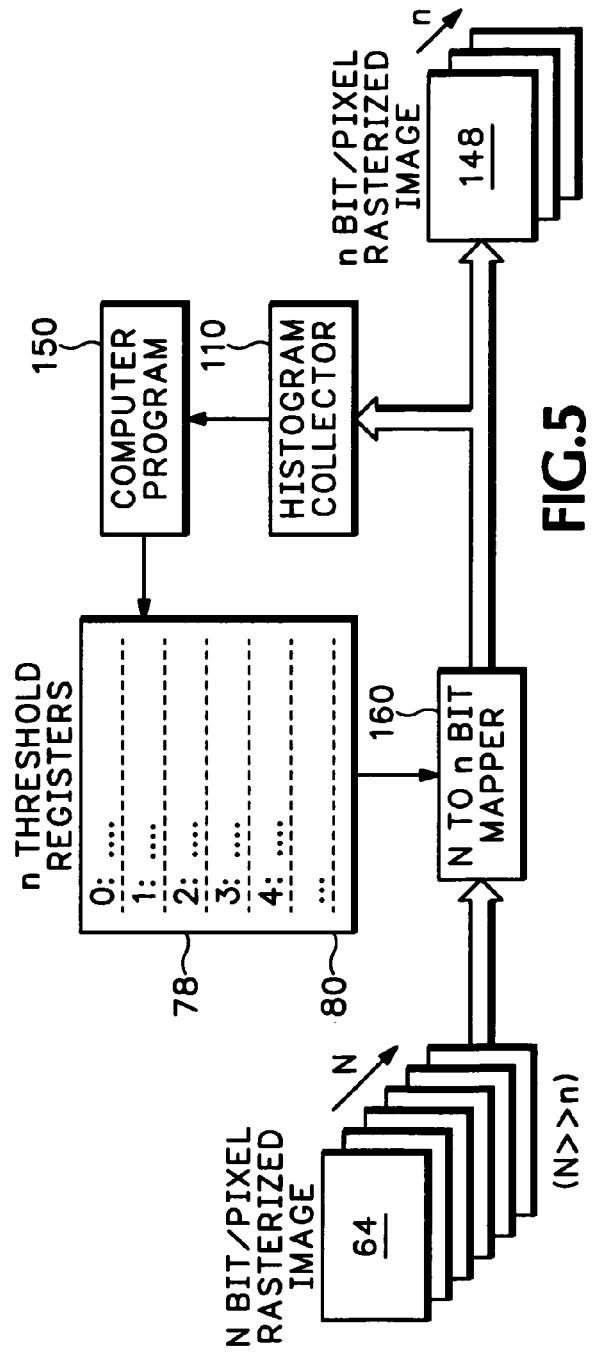
FIG. 5 is a schematic block diagram of a portion of an oscilloscope utilizing a first embodiment of the present invention.

Referring to FIG. 5, a first embodiment of the present invention begins with a rasterized input image 64 which is processed by an image mapper 61, the mapper typically reducing the number of bits per pixel from 32 to 8 (or less). The mapper 61 converts or transfers the N bits/pixel of intensity appearing in the input rasterized image 64 to the lesser n bits/pixel that are available for display in the output image 148. The mapped raster image 148 is forwarded to a histogram collector 110 and the intensity levels of that image are processed by computer program 150 in order to equalize the pixel distribution within image. In this primarily software implementation of the invention, the histogram collector 110 is composed primarily of memory along with a suitable microprocessor for interacting with the computer program 150.

Figure 6:
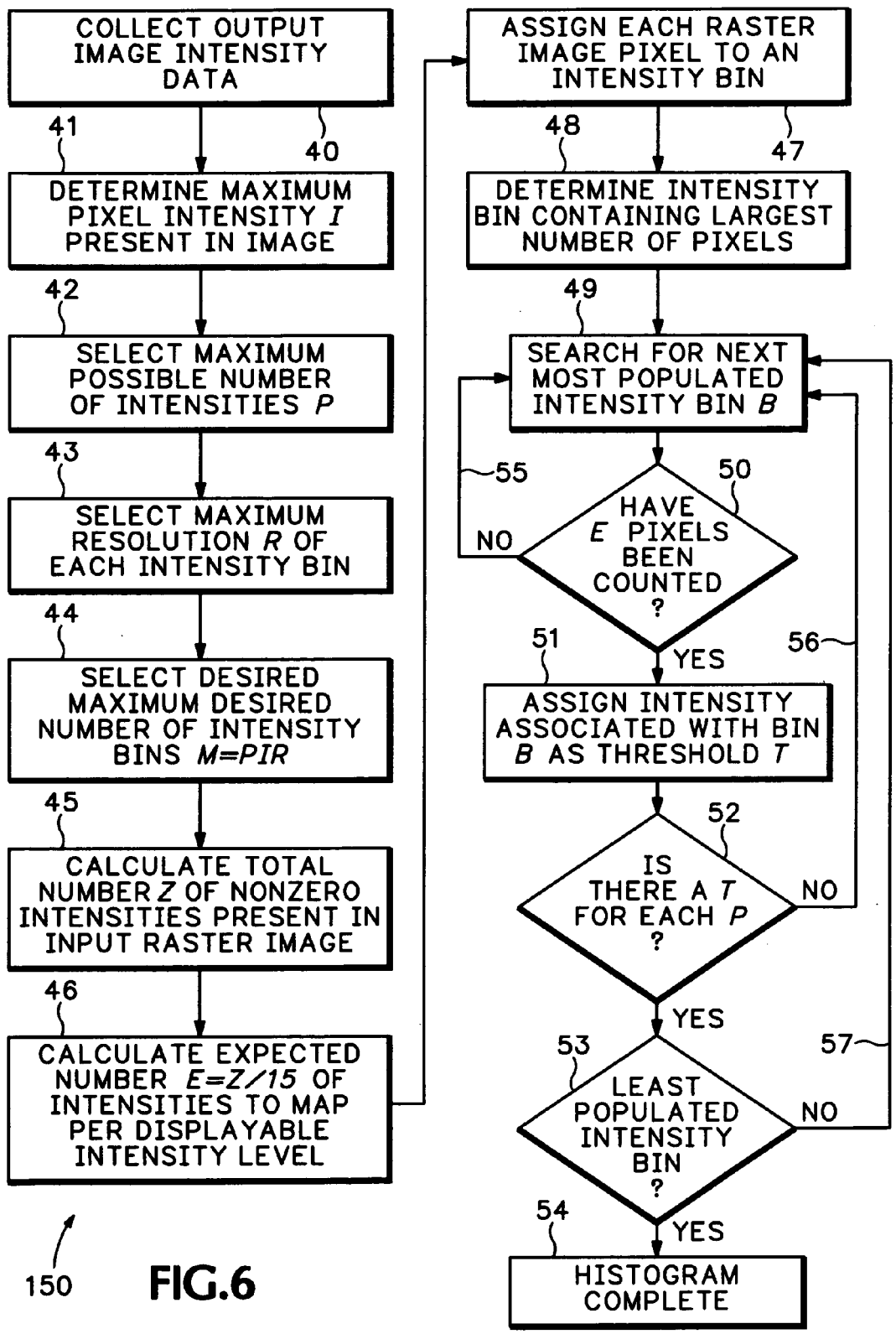
FIG. 6 is a flow chart depicting a portion of the software present in the first embodiment of the present invention.

Referring also to FIG. 6, the program 150 begins at step 40 by collecting the output raster image 148 intensity data. At step 41, the maximum intensity I present in output image 148 is identified. All of the unmapped intensities P existing in the raster image 148 are divided into a plurality of bins stored in threshold register 78, where each bin represents a range of possible display intensities. At step 42, in order to optimize the size of each intensity bin used, the number of intensities between the maximum intensity pixel and zero is utilized as the maximum possible number of intensities. The desired intensity resolution or range R of each intensity bin is selected at step 43.

The maximum number M of the intensity bins required to capture all of the possible display intensities depends on the value of the maximum intensity I found in the rasterized image 148 and the desired intensity resolution or range R of each intensity bin. Step 44 calculates the maximum number of intensity bins according to the formula M=P/R. The resolution of an intensity bin is therefore equal to the number of intensities between maximum pixel intensity and zero divided by the total number of intensity bins which are desired or can be accommodated. At step 45 the total number of nonzero intensities Z present in the image is measured. The number of probable or expected intensities E to be mapped for each displayable intensity level is the total number of nonzero intensities in image 64 divided by the number of displayable intensity levels (assumed to be fifteen, for example). Thus step 46 solves the equation E=ZA/15.

Step 47 assigns each image intensity element to an intensity bin. At this point the actual distribution of image intensities is unknown. In order to determine the actual threshold or boundaries of each intensity bin, the program initially examines at step 48 the intensity bin which contains the largest number of data elements. At step 49 the program then searches for the first intensity bin which contains the next fewest data elements which occurs after the expected number of intensities per displayable intensity level has been encountered at step 50. The intensity B associated with this intensity bin establishes the first threshold $T_1$. Alternatively, the thresholds T can be assigned from a table or according to a protocol designed to create histograms having a desired shape or characteristic. This search process continues until all the available intensity levels remaining to be mapped have been assigned established thresholds (at step 52) or the last data contained in intensity bin 80 (FIG. 5) is reached at step 53. The completed histogram 54 is thus available for application to the next succeeding input image 64. Note that when searching from the most to the least populated intensity bin the expected or probable number of intensities E might be found several times over in one intensity bin or require several intensity bins to achieve.

One shortcoming of this threshold defining method is that a disproportionately large value for the maximum number of image pixels to be mapped may cause the intensity bins to create a relatively coarse output image 148. Additionally, if a large number of pixels have very similar intensity levels, they may all be absorbed by a single intensity bin.

Either of these two conditions may cause the creation of fewer thresholds than is appropriate for the number displayable intensity levels. In order to compensate for this shortcoming, the computer program 150 must use a large number of intensity bins. For example, to effectively map fifteen displayable intensity levels as well as perform reasonable histogram equalization, the program 150 can create on the order of fifty thousand intensity bins. Due to the substantial amounts of memory required, this software implementation of the present invention cannot always be utilized.

Figure 1:
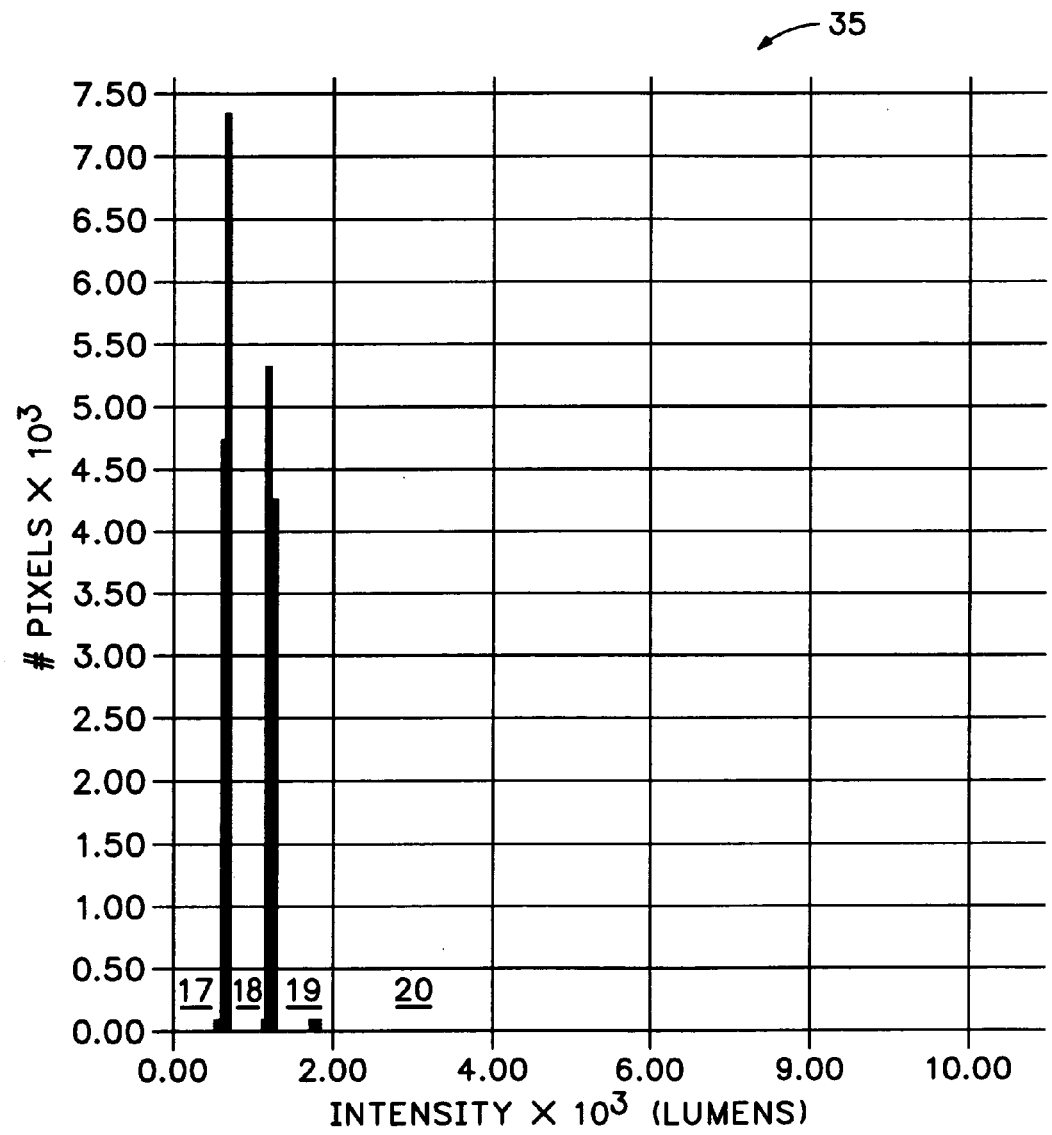
FIG. 1 is an example of the histogram of an input image of a television sweep signal.
Figure 2:
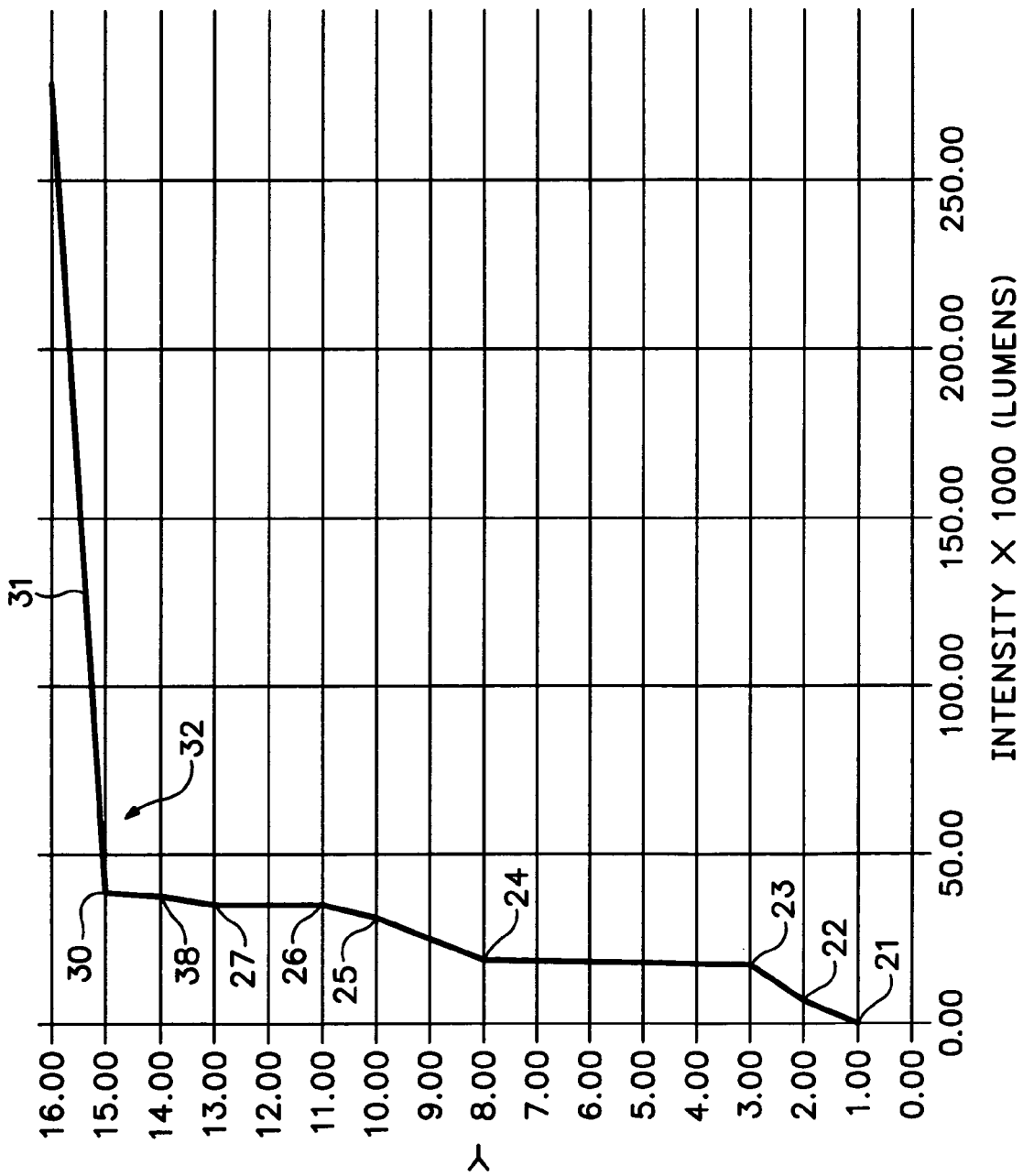
FIG. 2 is an example of an input to output transfer function that applies histogram equalization to the histogram depicted in FIG. 1.
Figure 3:
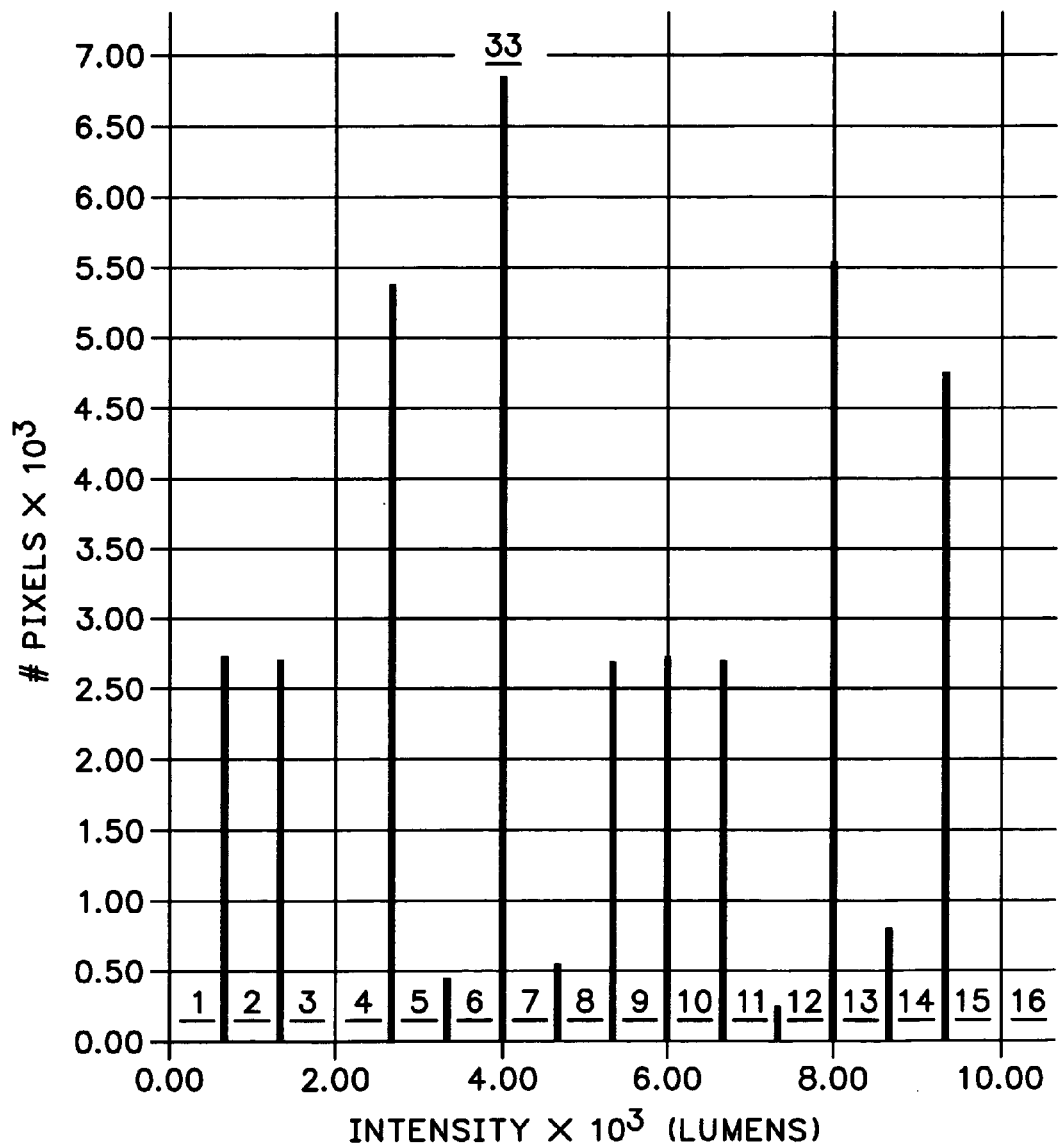
FIG. 3 is an example of the histogram of an output image of a television sweep signal after application of the transfer function depicted in FIG. 2.
Figure 4:
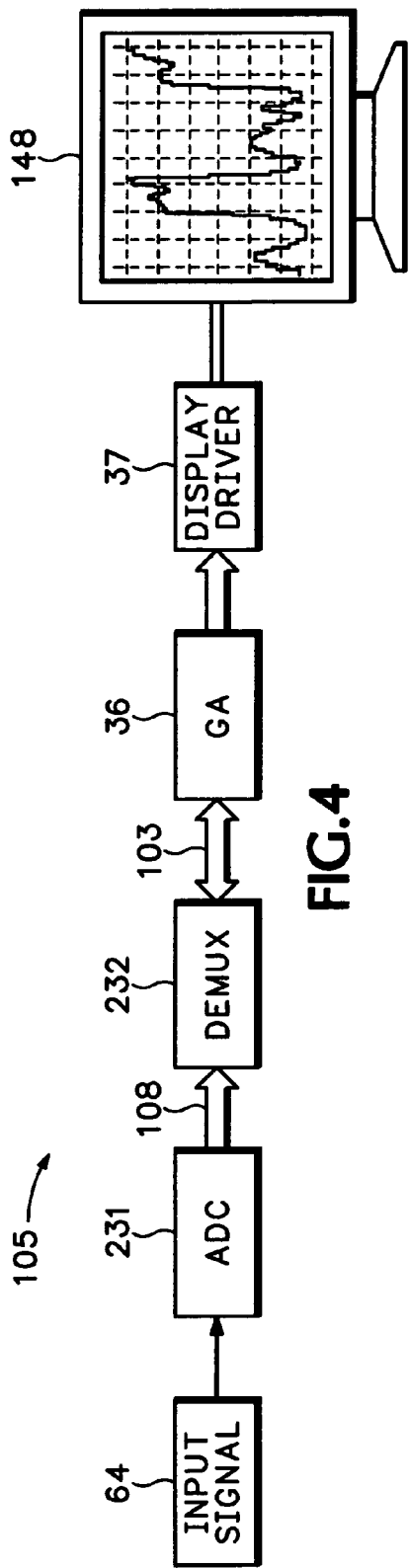
FIG. 4 is a schematic block diagram of a circuit utilized in an oscilloscope that incorporates the principles of the present invention.

Referring to FIG. 4, a second embodiment 105 of the present invention places a greater reliance on hardware than was used by histogram collector 110, while simplified software is able to calculate interpolated intensity bin thresholds based upon the intensity histogram. The hardware based method can be divided into three phases which are performed each time an output image 148 is mapped. The first phase is a premapping scan through the input raster image 64 to be mapped in order to create an intensity histogram. The intensity bin boundaries are defined with default values derived from maximum detected pixel intensity. The second phase is a software calculation of fifteen (for example) initial mapping thresholds which can also be forwarded to the premapping hardware in order to improve its next iteration of intensity bin thresholds. The third phase is to map the raster image from thirty two bits to eight bits. Additionally, while mapping, the intensity histogram can also be recalculated to improve the intensity bin thresholds once again.

Figure 7:
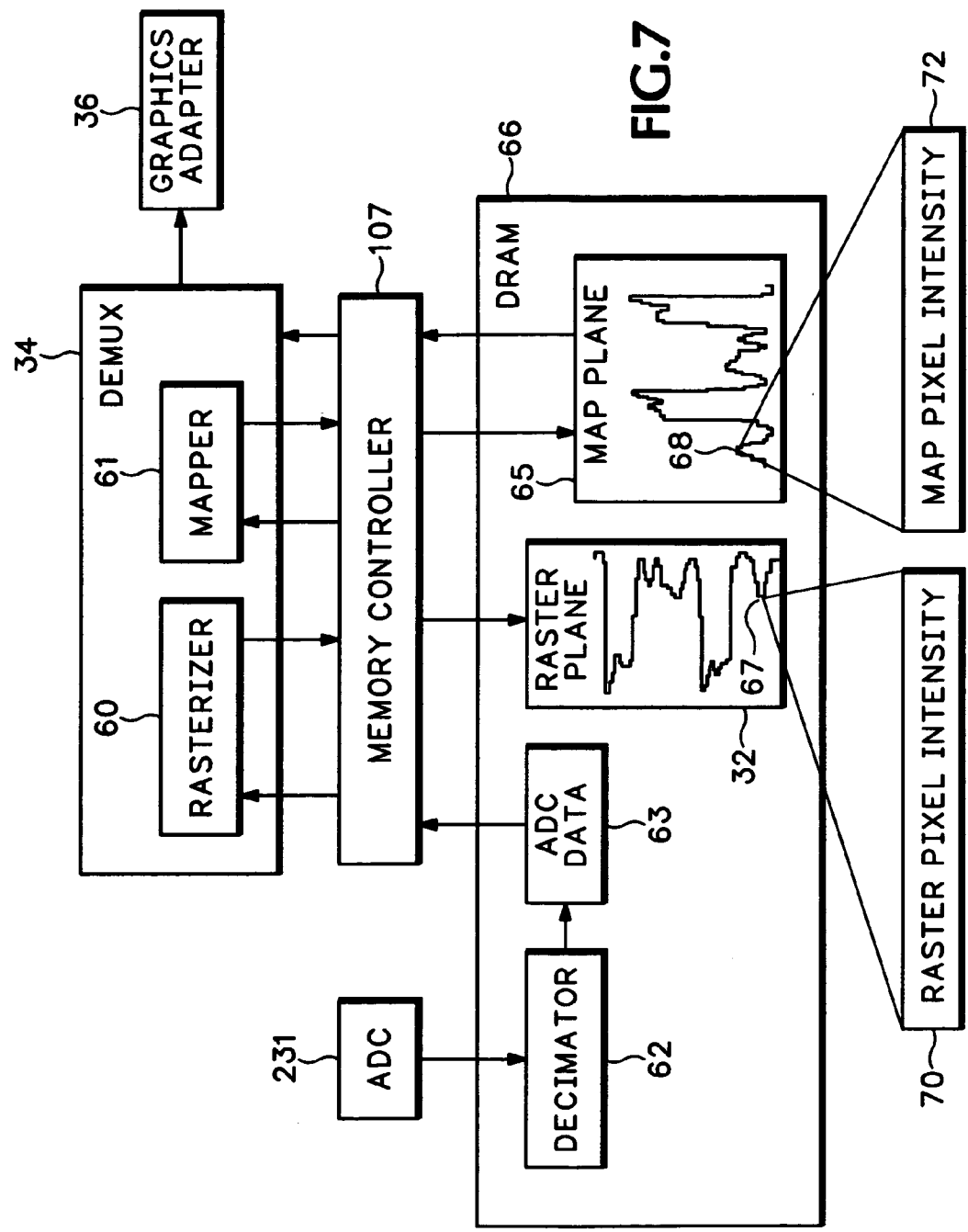
FIG. 7 is a schematic block diagram of a second embodiment of the present invention.

The histogram data collection and equalization system 105 may operate with any suitable rasterized source data 64 intended for presentation on an oscilloscope screen. The signal data 64 is forwarded to an analog to digital converter 231. The demultiplexer 232 receives data from A/D converter 231 along signal path 108 and makes data available along bus 103 to the remaining downstream components of the system 105. Referring also to FIG. 7, parallel data processing functions are performed by decimator 62, memory controller 107, and flat plane graphics adapter 36. The memory controller 107 is the interface to the dynamic read only memory (DRAM) 66 used to contain the data samples 63 obtained from the A/D converters 231. The decimator 62 takes the incoming sample stream from A/D converter 231 and discards some of the samples in order to obtain the required sample data 63.

Figure 8:
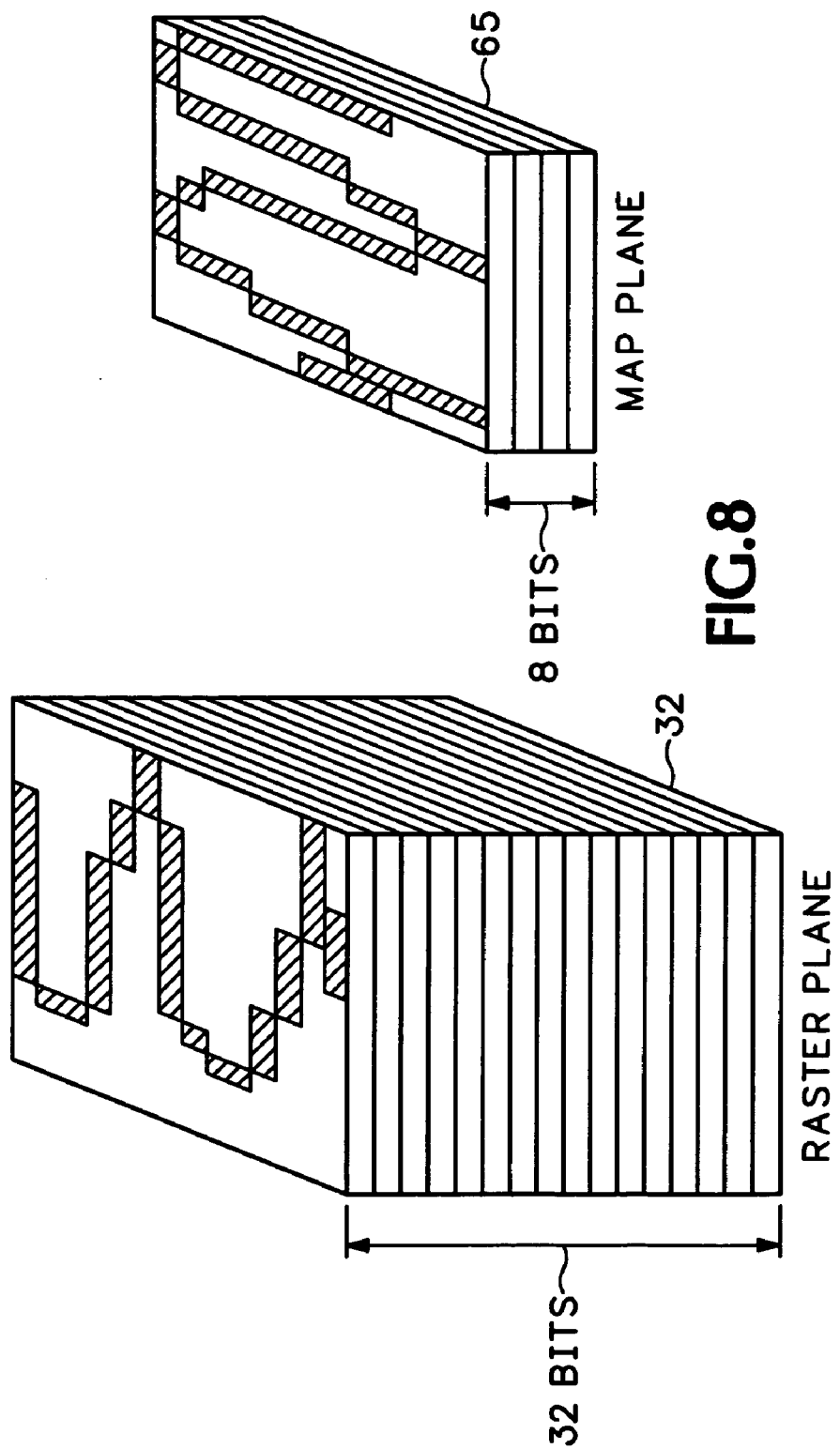
FIG. 8 is a graphical representation of the effect of the transfer function applied by the mapper depicted in FIG. 7.
Figure 9:
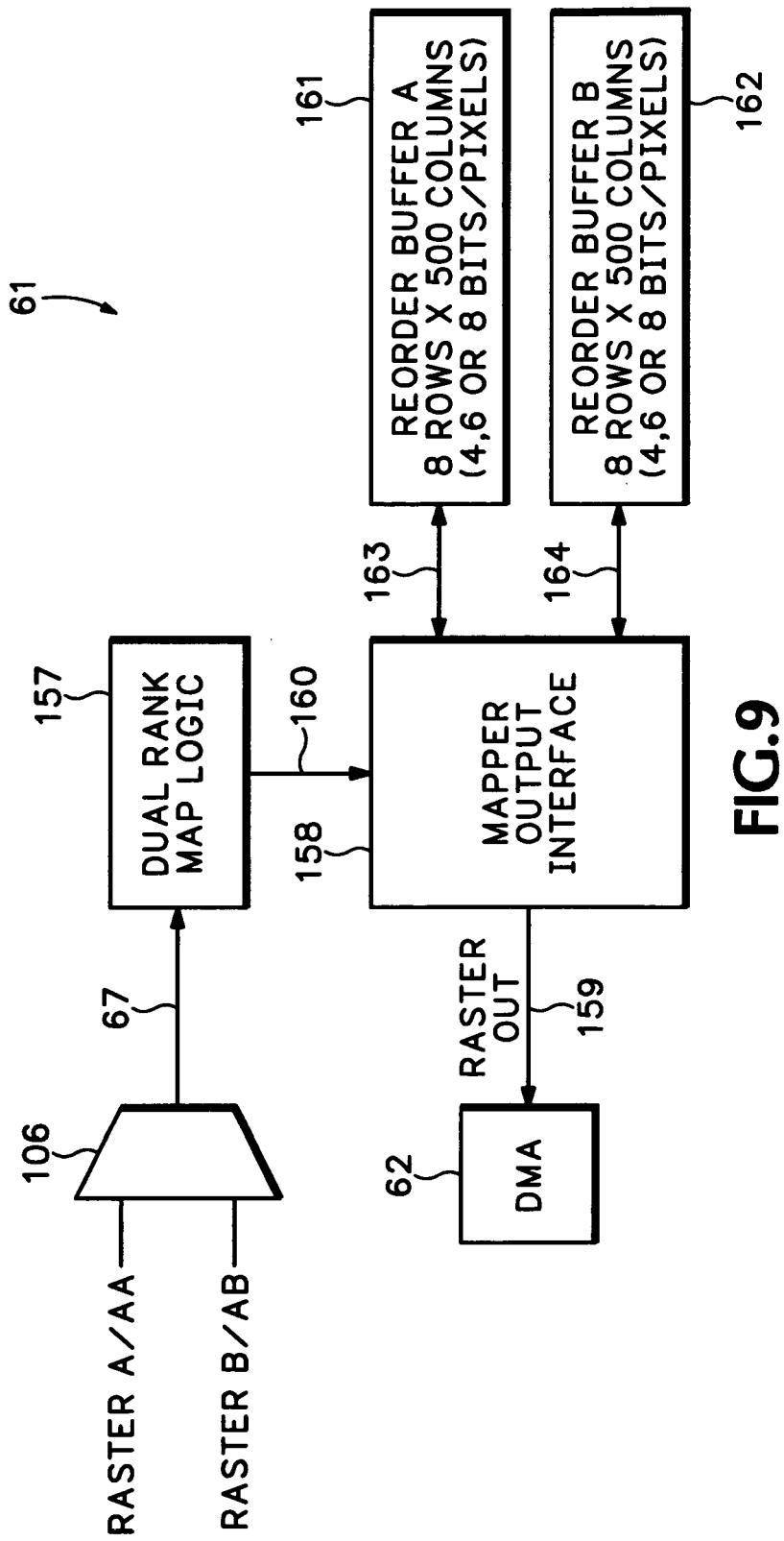
FIG. 9 is a block diagram of the mapper depicted in FIG. 7.

The rasterizer 60 derives an image from the sample stream of data 63 which is stored in circular buffers in memory. Each collection of data is referred to as an acquisition. The rasterizer 60 creates images by means of record view compression, a technique that takes point values as inputs and draws the vertical vector between them. This action is performed repetitively, thereby compressing many samples into a single column. Referring also to FIG. 8, the collection of all the column outputs produced by the record view compression process creates the raster plane 32. The raster plane 32 resides in memory 66 first from the top to the bottom of the image and then from the left to the right of the image. This particular ordering protocol is incompatible with display devices such as cathode ray tubes and liquid crystal displays because those technologies were developed for the electron beam concept which scans the screen from left to right and then from top to bottom. The mapper 61 transposes the raster plane 32 in memory 66 from column major to row major format.

Figure 10:
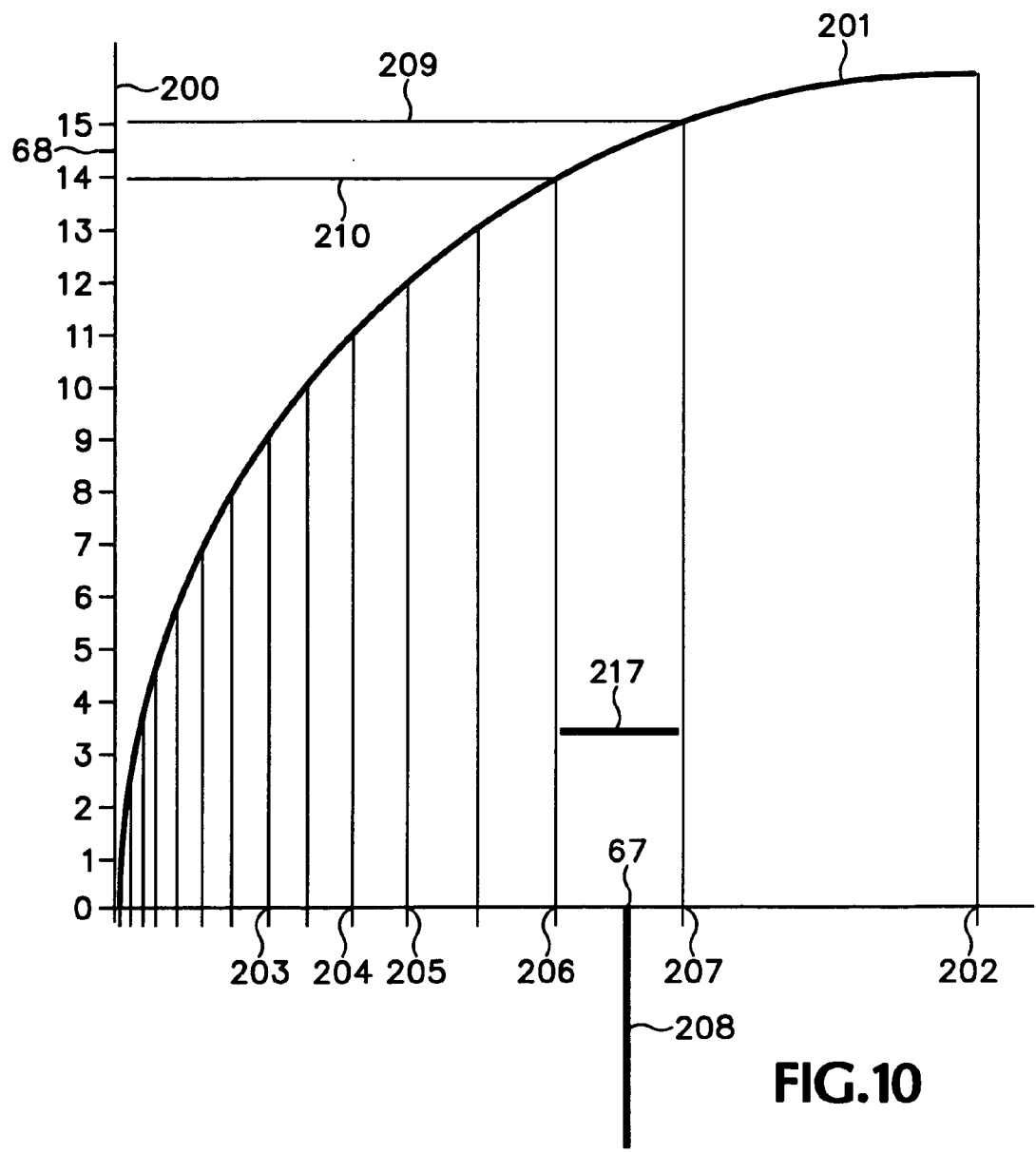
FIG. 10 is a graph depicting the mapping threshold logic employed for the coarse threshold determination function utilized in the present invention.

The rasterizer 60 draws a two dimensional graphical representation of the A/D sample data 63 into a section of random access memory 66 (the raster plane 32) where each pixel 67 (FIG. 7) is thirty two bits deep (FIG. 8). Referring also to FIG. 10, the mapper 61 then processes the raster plane data 32 by applying a nonlinear mapping function 201 in which the thirty two bit pixels (such as pixel 67) are reduced to eight bit pixels (such as pixel 68). During this process, pixels having similar intensities are separated by a process of histogram equalization and a new image field, the map plane 65, is created. The thirty two bit raster intensity field 70 becomes the four, six or eight bits contained in the map intensity field 72. The demultiplexer 34 transfers image data to image history storage devices such as the graphics adapter 36, the graphics adapter 36 being a logic device used to communicate with a microprocessor and the display driver 37 (FIG. 4). The memory controller 107 is the interface to DRAM 66. In an effort to support the required data bandwidth, the memory controller 107 handles the process of precharging, charge holding, and refreshing the DRAM 66.

Referring also to FIGS. 9, 12, 13, 14 and 15 the main function of the mapper 61 is to convert the thirty two bit intensity thresholds per pixel that appear on signal path 167 from the raster plane 32 into an equal number of four, six or eight bit per pixel intensity values which are to be mapped into each of the 256 available intensity levels of the map plane 65. The mapper 61 always produces an eight bit value, with four and six bit results being obtained by truncating the desired number of least significant bits from the eight bit value. This extracts the maximum intensity variation and therefore the maximum available information during the thirty two bit to eight bit intensity pixel mapping process. The mapper 61 computes the mapping thresholds for every rasterized input image 64 which is mapped. FIG. 8 is a graphical representation of the raster plane 32 (the source plane) and the map plane 65 (the created plane). A comparison of the raster plane 32 and the map plane 65 shows that the map plane 65 is rotated ninety degrees in memory 66. The ninety degree rotation is representative of the transfer function 201 transposition performed on the raster plane 32.

Figure 14:
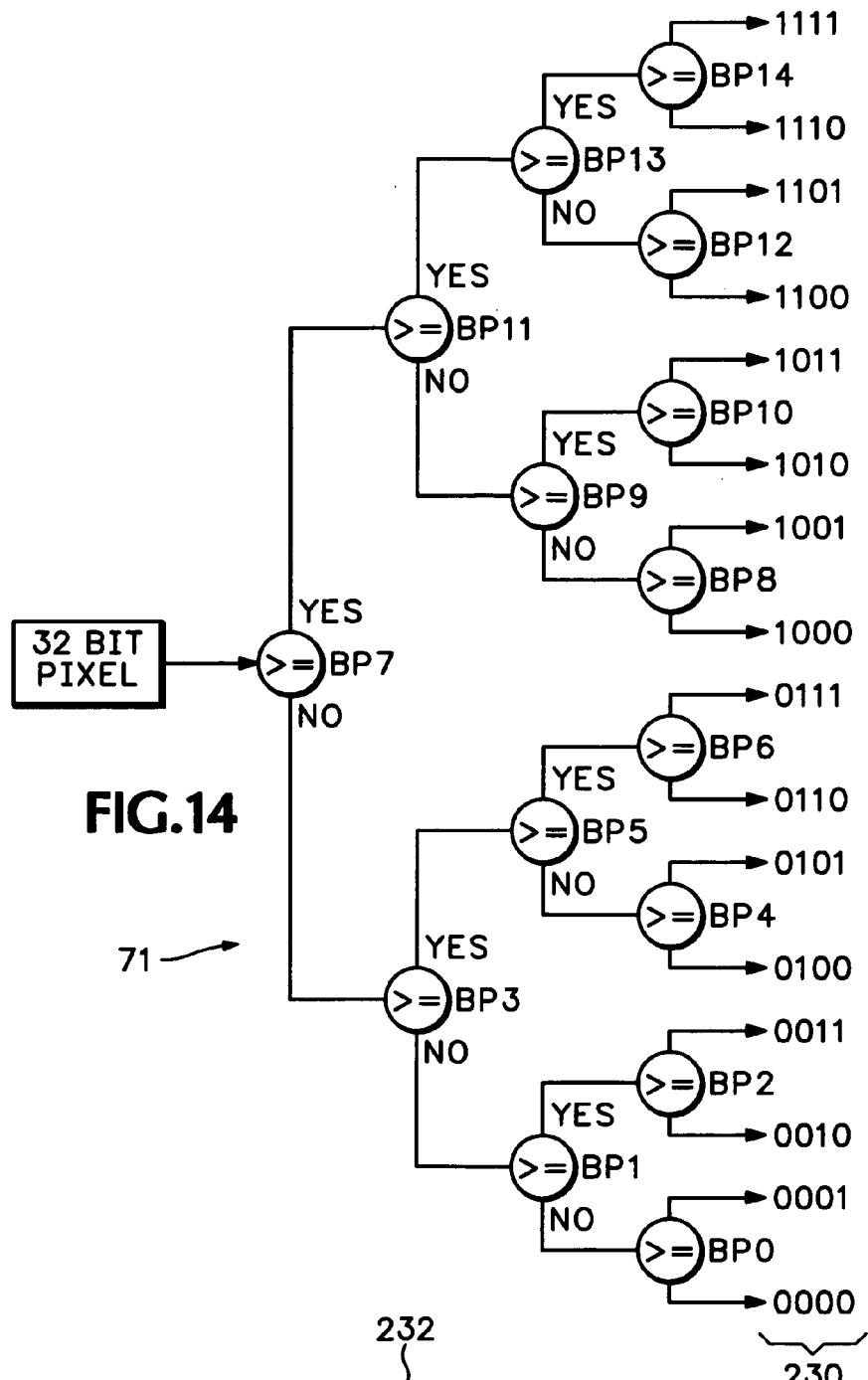
FIG. 14 is a block diagram of the coarse nibble mapper logic utilized in the present invention.
Figure 15:
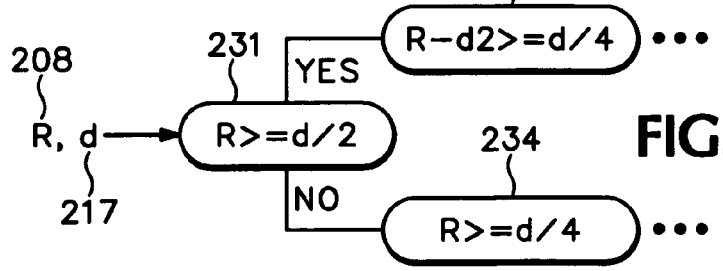
FIG. 15 is a graph depicting the mapping threshold logic employed for the fine nibble threshold determination function utilized in the present invention.

The thirty-two-bit to eight-bit mapping operation is performed by dual rank threshold circuit 157. The dual rank logic 157 of mapper 61 forwards the threshold data along signal path 160 to the mapper output interface 158, which compresses or packs any eight bit data to four bits and writes the eight (or four) bit data into reorder buffers 161 and 162 via signal paths 163 and 164 respectively. The threshold circuit 157 includes a map point reader 226 (FIG. 13) which receives one or two thirty two bit pixel images from the DRAM 66 via memory controller 107. This image data is forwarded to the coarse thresholding transfer function 201. The thirty two bit value of input pixel 67 on axis 202 is transformed into 8 bit output pixel 68 appearing between points 209 and 210, for example, on axis 200 via the coarse nibble transfer function 201. The coarse mapping function 201 defines fifteen programmable thresholds allowing for sixteen possible coarse nibble codes 220 including, for example, breakpoints 203, 204, 205, 206 and 207 which reside on axis 202. As seen in FIG. 14, the top (most significant) four bits appearing in column 230 are nonlinear and are the output of the tree structure 71. The histogram thresholds 203–207 and the thirty two bit pixels 67 are the inputs to the function 201, with the values appearing in column 230 being used as an index to increment a histogram bin counter. Each breakpoint (BP7, BP3, BP11, for example) is a comparator with a value that is programmable by either a microprocessor or digital signal processor.

The remaining value 208 as seen in FIG. 10 is obtained by operator 221 (FIG. 12) subtracting from the next thirty two bit pixel value the highest breakpoint 206 that is less than the next thirty two bit number. The coarse remainder 208 is then mapped using the linear function 212 (FIG. 15) to create the fine nibble codes 222 by using by using sixteen derived breakpoints appearing along axis 213. The sixteen derived breakpoints for the fine nibble function 212 are obtained by dividing equally the threshold range between the selected coarse breakpoint 206, for example, and the next largest coarse breakpoint 207.

Whenever a nonzero pixel is processed by the coarse transfer function 201 the mapPreMap counter 227 (FIG. 13) monitors which threshold region was utilized by that pixel, and this count is forwarded to the map registers 237. All nonzero pixels processed by the fine nibble threshold function 212 are in the form of eight bit pixels which are processed (truncated to four bits if necessary) by the map ReOrder Buffer stage 228 and the value is written into reorder buffers 161 and 162. The Reorder Buffer popper or counter 229 receives a prompt from the bus communications circuitry associated with graphics adapter 36 and advances its pointers to an empty reorder buffer 161 or 162 in response to that prompt. The popper or counter 229 operates based on two pixel modes settings. The first setting selects either four, six or eight bit pixels, and the second mode setting selects either four or eight bit packing.

The pixel mode determines the size of data in each pixel 67 and the bit packing determines how many bits a pixel uses when it is forwarded to the graphics adapter 36.

Initially, the ranges for each of the sixteen pixel intensity thresholds or bins (BIN 0 through BIN 15) are preset based on the maximum pixel intensity (MPI) to:

BIN 15 Intensity Range=(14/15*MPI)<intensity<=MPI
BIN 14 Intensity Range=(13/15*MPI)<intensity<=(14/15*MPI)
BIN 13 Intensity Range=(12/15*MPI)<intensity<=(13/15*MPI)
BIN 12 Intensity Range=(11/15*MPI)<intensity<=(12/15*MPI)
BIN 11 Intensity Range=(10/15*MPI)<intensity<=(11/15*MPI)
BIN 10 Intensity Range=(9/15*MPI)<intensity<=(10/15*MPI)
BIN 9 Intensity Range=(8/15*MPI)<intensity<=(9/15*MPI)
BIN 8 Intensity Range=(7/15*MPI)<intensity<=(8/15*MPI)
BIN 7 Intensity Range=(6/15*MPI)<intensity<=(7/15*MPI)
BIN 6 Intensity Range=(5/15*MPI)<intensity<=(6/15*MPI)
BIN 5 Intensity Range=(4/15*MPI)<intensity<=(5/15*MPI)
BIN 4 Intensity Range=(3/15*MPI)<intensity<=(4/15*MPI)
BIN 3 Intensity Range=(2/15*MPI)<intensity<=(3/15*MPI)
BIN 2 Intensity Range=(1/15*MPI)<intensity<=(2/15*MPI)
BIN 1 Intensity Range=(0 MPI)<intensity<=(1/15*MPI)
BIN 0 Intensity Range=(all non-zero intensities)

After the rasterized image data 64 is mapped with the preset bin thresholds, the next step is to calculate the desired intensity ranges based on the actual contents of the intensity bins numbered BIN 15 through BIN 1. The intensity range calculation begins with a premapping step performed by mapPreMap counter 227 (FIG. 13) which examines all of the thirty two bit intensities in the entire image 64. Each intensity bin will maintain a seventeen bit count representing the number of intensities falling within its defined intensity range. The seventeen bit value is derived from the worst case count should all of the pixels in an image fall within 1 bin. The mapPreMap counter 227 determines the Average Bin Count, which is equal to the (BIN 0 count)/15, where the BIN 0 count equals the number of pixels having non-zero intensities. The existing histogram intensity bin counts residing in map register 237 are compared to the average bin count in order to calculate new intensity bin ranges. The goal in calculating the new thresholds is to cause the number of data points (pixels) contained in each intensity bin to be equal. An example of a C code subroutine which can perform such a bin count optimization is shown in Table 1.

TABLE 1

```
k = 0;
j = 0;
thrsh[0] =0;
thrsh[15] = maxPix;
binSum =0;
for(i=1;i<16;i++) {
    binSum += binCount[i];
    while (binSum >= avgBinCnt) {
        binSum = binSum − avgBinCnt;
```

TABLE 1-continued

```
        newThrsh[j+1] = thrsh[k]
            +((( binCount[i] - binSum)/binCount[i]) * (thrsh[k+1] - thrsh[k]));
        j++
    }
    k++;
}
```

The ranges for BIN 1 thru BIN 15 are defined by the mapping thresholds. There are thus fourteen mapping thresholds and fifteen intensity ranges. The lower range boundary for BIN 1 is 1 unit of pixel intensity. The upper range boundary for BIN 15 is the current maximum pixel intensity of I units of pixel intensity. Referring to Table 1, the threshold generated by the subroutine is the upper threshold for the intensity bin associated with that threshold. For example, newThrsh[2] is the upper limit of pixel intensity for the BIN 2. The mapper 61 extracts the fourteen mapping thresholds that are obtained from the foregoing calculation, thereby resulting in a set of optimized bin thresholds to be applied as the coarse thresholding transfer function 201. In summary, the algorithm starts with the default mapping from the rasterized input image 64 to the fifteen (for example) available display colors for output image 148, and then maps the image 64 from thirty two to eight bits, but counts the number of times each available color or intensity is used. The number of colors in each bin is used to adjust the default mapping so that during the next iteration each color or intensity is used an equal number of times in the output image 148.

Figure 11:
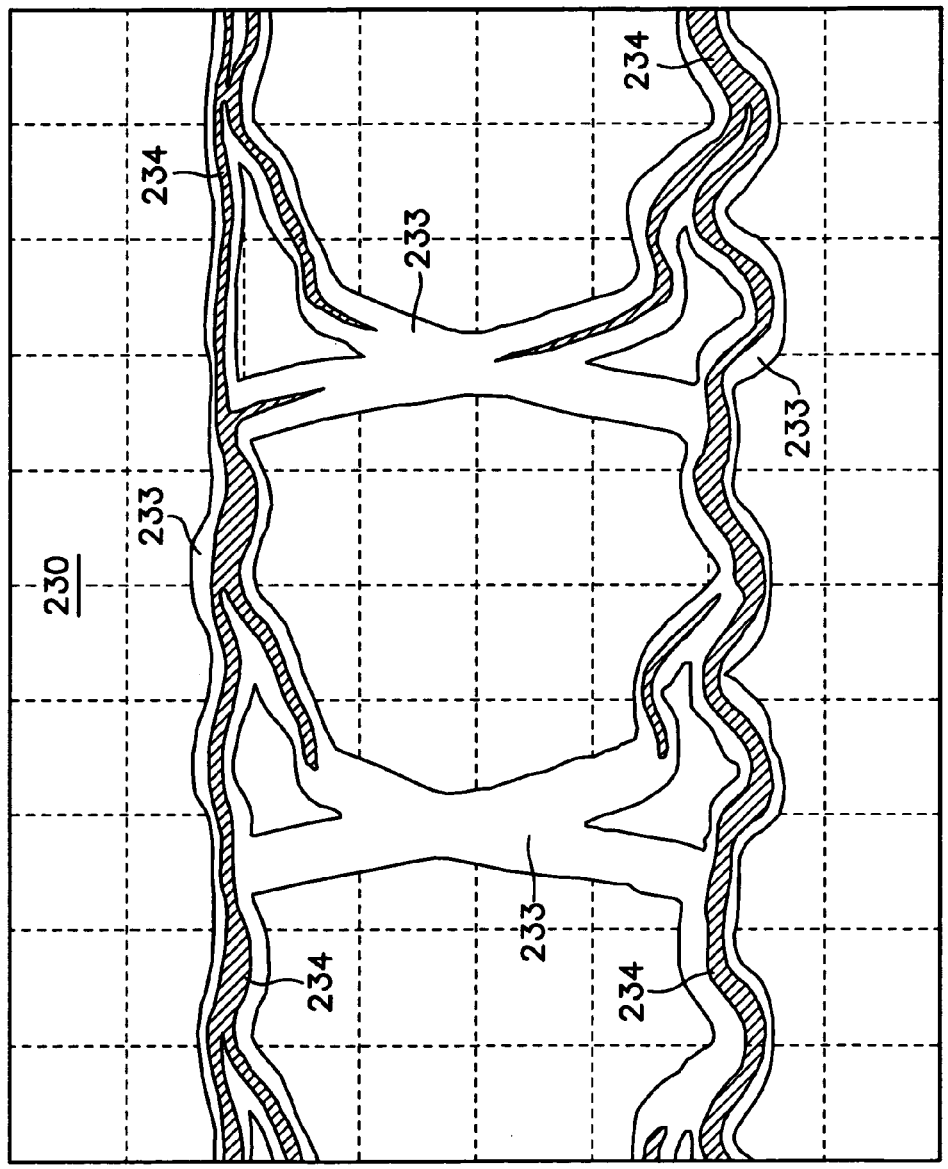
FIG. 11 is an pictorial representation of an image produced by a prior art oscilloscope.
Figure 12:
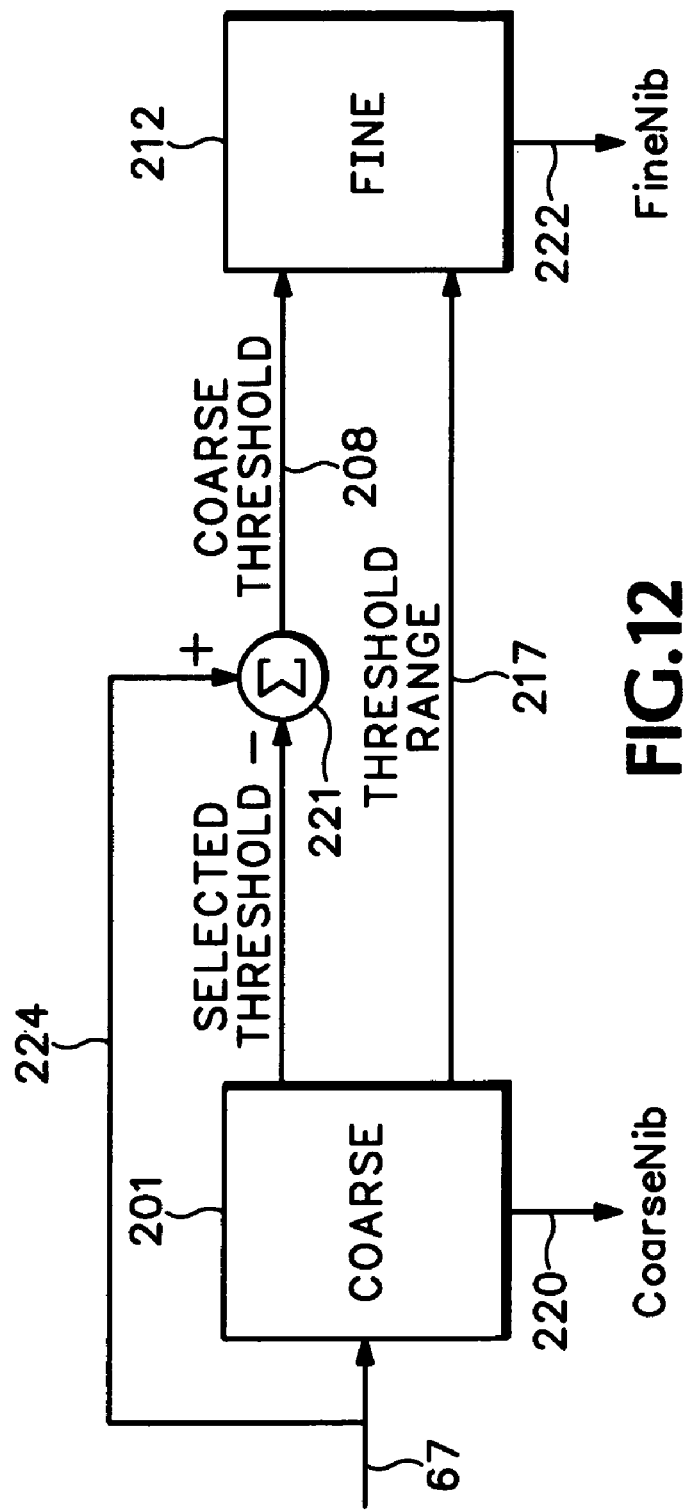
FIG. 12 is a block diagram depicting the relationship of the coarse and fine threshold determination functions as applied to an image processed by the present invention.
Figure 13:
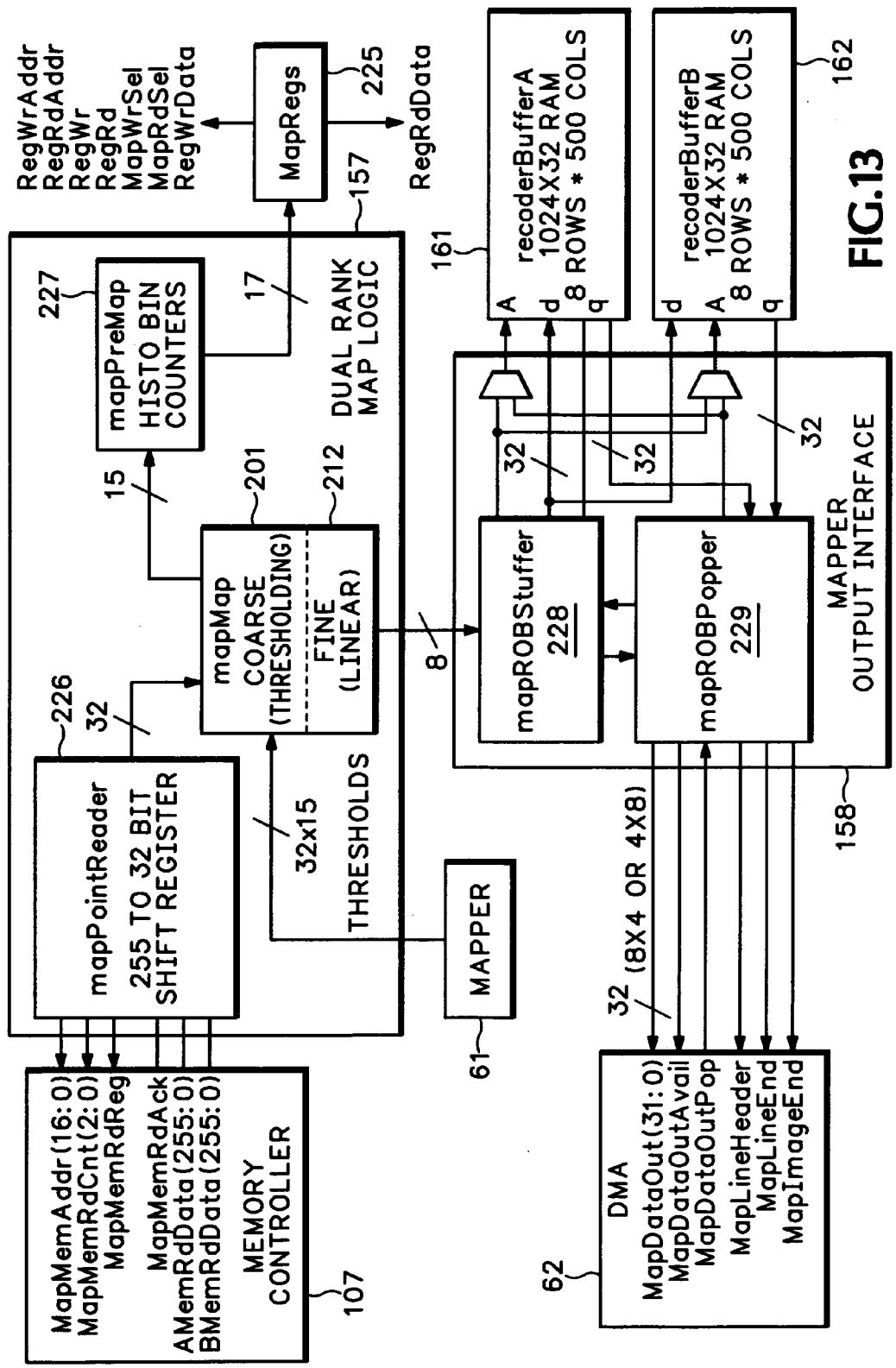
FIG. 13 is a detailed block diagram of the mapper depicted in FIG. 7.
Figure 16:
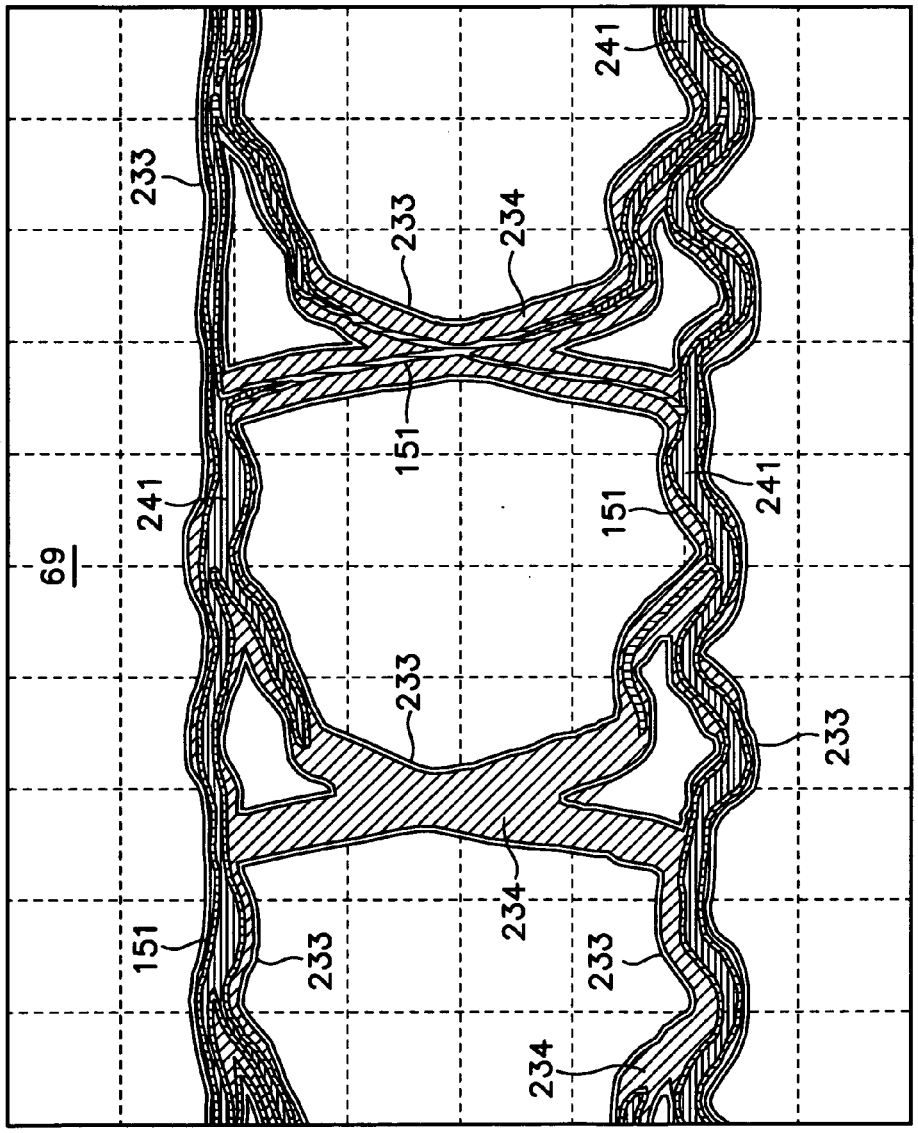
FIG. 16 is a pictorial representation of the image produced by an oscilloscope utilizing the histogram equalization principles of the present invention.

The mapping operation performed by dual rank logic program 157 occurs while simultaneously calculating another intensity histogram. The bin counts obtained from the most recently calculated histogram are used to once more optimize the intensity bin ranges of the map registers 237. Ultimately, the intensity bin ranges will be set prior to each pre-mapping or mapping phase, with bin ranges calculated from the previous pixel intensity histogram results. Default values will always be used when starting from the initial or stop state. In an alternate embodiment of the present invention, the software program invokes a histogram grading protocol which causes the premapping phase to iterate yet again should the histogram effort fail to achieve certain predefined criteria such as a large maximum pixel change from the previous reading. Referring to FIG. 16, the effect of the histogram equalization system of the present invention can be appreciated by viewing image 69 and making a comparison with the image 240 depicted in FIG. 11. While the blue 233 and green 234 pixels are still present, additional colors such as red 241 and yellow 151 are also present, providing additional resolution and accuracy.

What has been described is a system for equalizing the distribution of pixel intensities in an image displayed by an oscilloscope. In a primarily software implementation, the maximum pixel intensity (I) present in the rasterized input image, the maximum available display intensity (P) and the desired image resolution (R) are the input variables which permit the calculation of thresholds or bins to which each pixel is assigned. By iteratively performing the analysis of existing pixel intensities and bin thresholds, the number of pixels in each bin may be optimized to form an equalized histogram. Another implementation of the histogram equalization system utilizes software to optimize a hardware-based histogram collector. An N bit/pixel rasterized input image is processed by an N to n bit mapper, where N>n. A dual rank map logic subroutine creates a first set of coarse histogram bins or thresholds and a second set of fine thresholds or nibbles, each of the fine nibbles being sixteen equally spaced bins residing within a single coarse threshold or bin. A histogram equalization function adjustment algorithm progressively examines the distribution of coarse thresholds and adjusts the breakpoints to create an optimized histogram.

What is claimed is:

1. An apparatus for collecting histogram data for an output image to be presented on a display device, comprising:
   an input image, the input image containing N bits per image pixel,
   a mapper, the mapper converting the input image into the output image, the output image having n bits per pixel, where N>n,
   a histogram collector, the histogram collector forming a histogram of the output image by storing a pixel intensity distribution of the output image; and
   a histogram equalization function adjustment subroutine, the function adjustment subroutine redefining boundaries of output image pixel intensity distribution present in the histogram such that existing output image pixel intensities are substantially evenly distributed across a range of intensities available to the display device.

2. The apparatus of claim 1 wherein the histogram comprises a plurality of pixel intensity bins, each intensity bin being defined by an upper and a lower boundary, the histogram equalization function adjustment subroutine adjusting the upper and lower boundary of each bin to cause a substantially equal number of output image pixels to reside in each pixel intensity bin.

3. The apparatus of claim 2, wherein the output image contains a finite number of pixel intensities, the histogram having only as many bins as the finite number of pixel intensities.

4. The apparatus of claim 3 further comprising:
   at least a first and second successive input image;
   at least a first and second successive histogram, the histogram collector forming the second successive histogram using intensity bin boundaries as redefined by the histogram equalization function adjustment subroutine for the first successive histogram.

5. The apparatus of claim 4 wherein the histogram equalization function adjustment subroutine operates at least once for each new histogram produced by the histogram collector.

6. The apparatus of claim 3 wherein the initial upper and lower boundary of each intensity bin
   is defined by a default value when no previous output image has been processed by the mapper; and
   is substantially equal to an upper and lower boundary created in response to a previous output image when a previous output image has been processed by the mapper.

7. The apparatus of claim 6 wherein the histogram equalization function adjustment subroutine operates only once for each new histogram produced by the histogram collector.

8. The apparatus of claim 7 wherein the mapper creates the output image and the histogram collector creates the histogram of the output image substantially simultaneously.

9. The apparatus of claim 8 wherein the histogram collector creates a histogram having a desired programmable histogram shape.

10. The apparatus of claim 9 further comprising a histogram grading protocol, the histogram grading protocol requiring recalculation of the histogram whenever a selected histogram parameter criterion is not met.

11. A system for creating and progressively adjusting a histogram produced for an image to be displayed on an oscilloscope, comprising:
   a rasterized input image;
   a microprocessor capable of delivering and receiving data from components of the system,
   a memory, the memory storing the rasterized input image as a raster plane;
   a mapper, the mapper converting image data contained in the raster plane into image data stored in the memory as a map plane;
   a histogram collector, the histogram collector creating a histogram of the image data stored in the map plane; and
   a histogram equalization function adjustment subroutine, the subroutine adjusting histogram characteristics such that map plane pixel intensities are substantially equally distributed within the histogram.

12. The system of claim 11, wherein the histogram further comprises a plurality of pixel intensity bins, the mapper causing each bin to contain a substantially equal number of map plane pixels.

13. The system of claim 12, wherein the mapper further comprises a coarse nibble transfer function, the coarse nibble transfer function having map plane image data as an input and a corresponding location within a pixel intensity bin as an output.

14. The system of claim 13 wherein each pixel intensity bin comprises an upper and a lower boundary, the histogram equalization function adjustment subroutine altering the upper and lower boundaries of at least some of the pixel intensity bins so as to cause each bin to contain a substantially equal number of map plane pixels.

15. The system of claim 14 wherein the mapper further comprises a fine nibble transfer function, the fine nibble transfer function dividing each pixel intensity bin of the coarse nibble transfer function into an equal number of equally spaced pixel intensity regions.

16. The system of claim 15 wherein the upper and lower boundaries of each pixel intensity bin are initially derived from the upper and lower boundaries produced in response to a previous image processed by the mapper.

17. The system of claim 16 wherein the histogram equalization function subroutine is applied iteratively to each map plane image until predetermined histogram parameters are achieved.

18. A method of equalizing a histogram produced in response to rasterized image data, comprising the steps of:
   determining the maximum pixel intensity present in the image data,
   selecting the maximum number of possible pixel display intensities,
   selecting the desired resolution of each histogram intensity bin;
   selecting the desired number of histogram intensity bins; and
   placing a substantially equal number of pixels in each intensity bin.

19. The method of claim 18, further comprising the step of calculating the total number of nonzero intensities present in the rasterized image data.

20. The method of claim 19, further comprising the step of calculating E, the expected number of intensities to map per displayable intensity level, according to the formula $E = Z/M$, where Z is the number of nonzero intensities present in the rasterized image data, and M is the maximum desired number of intensity bins.

* * * * *